(12) United States Patent
Kresge et al.

(10) Patent No.: US 7,024,764 B2
(45) Date of Patent: Apr. 11, 2006

(54) METHOD OF MAKING AN ELECTRONIC PACKAGE

(75) Inventors: John S. Kresge, Binghamton, NY (US); Robert D. Sebesta, Endicott, NY (US); David B. Stone, Jericho, VT (US); James R. Wilcox, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 753 days.

(21) Appl. No.: 10/040,745

(22) Filed: Jan. 7, 2002

(65) Prior Publication Data

US 2002/0059723 A1 May 23, 2002

Related U.S. Application Data

(62) Division of application No. 09/346,356, filed on Jul. 2, 1999, now Pat. No. 6,351,393.

(51) Int. Cl.
*H05K 3/34* (2006.01)

(52) U.S. Cl. .............................. 29/840; 29/830; 29/832; 29/841; 174/263; 228/180.21; 361/765

(58) Field of Classification Search .................. 29/825, 29/830–832, 834, 840, 841, 850, 851; 174/260, 174/261, 263, 255, 262; 228/180.1, 180.21, 228/180.22; 257/698, 700, 702, 759; 361/748, 361/792, 793, 795
See application file for complete search history.

(56) References Cited

U.S. PATENT DOCUMENTS

| 5,072,075 | A | 12/1991 | Lee et al. | 174/264 |
| 5,121,190 | A | 6/1992 | Hsiao et al. | 357/80 |
| 5,483,421 | A | 1/1996 | Gedney et al. | 361/771 |
| 5,574,630 | A | 11/1996 | Kresge et al. | 361/792 |
| 5,615,087 | A | 3/1997 | Wieloch | 361/719 |
| 5,691,041 | A * | 11/1997 | Frankeny et al. | 428/209 |

(Continued)

FOREIGN PATENT DOCUMENTS

JP  1-307294  12/1989

(Continued)

OTHER PUBLICATIONS

IBM Technical Disclosure Bulletin, vol. 32, No. 3B, Aug. 1989, "Multilayer Polymer Substrate for Direct Chip Attachment".

(Continued)

*Primary Examiner*—Marc Jimenez
*Assistant Examiner*—Donghai D. Nguyen
(74) *Attorney, Agent, or Firm*—Schmeiser, Olsen & Watts; William H. Steinberg

(57) ABSTRACT

A method of making an electronic package. The method includes forming a semiconductor chip and an multi-layered interconnect structure. The semiconductor chip includes a plurality of contact members on one of its surfaces that are connected to the multi-layered interconnect structure by a plurality of solder connections. The formed multi-layered interconnect structure is adapted for electrically interconnecting the semiconductor chip to a circuitized substrate (eg., circuit board) with another plurality of solder connections and includes a thermally conductive layer being comprised of a material having a selected thickness and coefficient of thermal expansion to substantially prevent failure of the solder connections between said first plurality of electrically conductive members and the semiconductor chip. The method forms the electronic package to further include a dielectric material having an effective modulus to assure sufficient compliancy of the multi-layered interconnect structure during operation.

16 Claims, 2 Drawing Sheets

U.S. PATENT DOCUMENTS

| | | | |
|---|---|---|---|
| 5,798,563 A | 8/1998 | Feilchenfeld et al. | 257/668 |
| 5,838,063 A | 11/1998 | Sylvester | 257/704 |
| 5,894,173 A | 4/1999 | Jacobs et al. | 257/790 |
| 5,900,675 A | 5/1999 | Appelt et al. | 257/778 |

FOREIGN PATENT DOCUMENTS

| | | |
|---|---|---|
| JP | 6-112271 | 4/1994 |
| JP | 9-232376 | 9/1997 |
| JP | 10-209347 | 8/1998 |
| JP | 11-87560 | 3/1999 |
| JP | 2000-022071 | 1/2000 |
| JP | 2000-024150 | 1/2000 |

OTHER PUBLICATIONS

"High Performance Carrier Technology: Materials And Fabrication", by Light et al, 1993 International Electronics Packaging Conference, San Diego, California, Volume One.

"High Performance Carrier Technology", by Heck et al., 1993 International Electronics Packaging Conference, San Diego, California, Volume One.

"Process Considerations in the Fabrication of Teflon Printed Circuit Boards", by Light et al, 1994 Proceedings, 44 Electronic Components & Technology Conference, May 1994.

* cited by examiner

METHOD OF MAKING AN ELECTRONIC PACKAGE

CROSS REFERENCE TO COPENDING APPLICATION

This application is a divisional application of Ser. No. 09/346,356, filed Jul. 2, 1999, now U.S. Pat. No. 6,351,393.

TECHNICAL FIELD

The present invention relates, in general, to an electronic package for mounting of integrated circuits, and in particular, to an organic multi-layered interconnect structure for use in such a package.

BACKGROUND OF THE INVENTION

Organic substrates for example printed circuit boards and chip carriers have been and continue to be developed for many applications. These are expected to displace ceramic substrates, in particular in many chip carrier applications, because of reduced cost and enhanced electrical performance. The use of a multi-layered interconnect structure such as an organic chip carrier for interconnecting a semiconductor chip to a printed circuit board in an electronic package introduces many challenges, one of which is the reliability of the connection joints between the semiconductor chip and the organic chip carrier and another of which is the reliability of the connection joints between the organic chip carrier and the printed circuit board.

As semiconductor chip input/output (I/O) counts increase beyond the capability of peripheral lead devices and as the need for both semiconductor chip and printed circuit board miniaturization increases, area array interconnects are the preferred method for making large numbers of connections between a semiconductor chip and an organic chip carrier and between the organic chip carrier and a printed circuit board. If the coefficient of thermal expansion (CTE) of the semiconductor chip, the organic chip carrier, and the printed circuit board are substantially different from one another, industry standard semiconductor chip array interconnections to the organic chip carrier can exhibit high stress during operation (thermal cycling). Similarly, the industry standard ball grid array (BGA) interconnections between the organic chip carrier and printed circuit board can also exhibit high stress during operation. Significant reliability concerns may then become manifest by failure of the connections or even failure of the integrity of the semiconductor chip (chip cracking). These reliability concerns significantly inhibit design flexibility. For example, semiconductor chip sizes may be limited or interconnect sizes, shapes and spacing may have to be customized beyond industry standards to reduce these stresses. These limitations may limit the electrical performance advantages of the organic electronic package or add significant cost to the electronic package. Typically a semiconductor chip has a CTE of 2–3 parts per million per degree Celsius (ppm/° C.) while a standard printed circuit board has a much greater CTE of 17–20 ppm/° C.

It is therefore desirable to reliably interconnect a semiconductor chip to a printed circuit substrate or board in a fashion that significantly improves electrical performance. An electronic package that includes a multi-layered interconnect structure, an organic chip carrier that is relatively compliant and made by selecting the materials and thickness of the materials to yield a chip carrier CTE of only about 10–12 ppm/° C., can substantially prevent failure of the interconnections between the semiconductor chip and the organic chip carrier and between the organic chip carrier and the printed circuit board. Furthermore, it can enable design of the electronic package to significantly improve electrical performance. It is believed that such a structure and method for making same would constitute a significant art advancement.

OBJECTS AND SUMMARY OF THE INVENTION

Accordingly, it is an object of this invention to enhance the art of electronic packaging by providing an electronic package with significantly improved electrical performance.

Another object of this invention is to provide a multi-layered interconnect structure for use in an electronic package, the multi-layered interconnect structure including a thermally conductive layer comprised of a material having a thickness and coefficient of thermal expansion to substantially prevent failure of solder connections between a semiconductor chip and a circuitized substrate.

Yet another object of this invention is to provide an electronic package having a semiconductor chip with a plurality of contact members connected by solder connections to a multi-layered interconnect structure.

Still yet another object of this invention is to provide a method of making such an electronic package having a multi-layered interconnect structure that is relatively compliant and includes a CTE so as to substantially prevent failure of solder connections between the semiconductor chip and the multi-layered interconnect structure.

Another object is to provide such a method and structure that are both adaptable to mass production, thus assuring lower costs.

According to one aspect of the invention, there is provided a multi-layered interconnect structure adapted for electrically interconnecting a semiconductor chip and a circuitized substrate using solder connections, the multi-layered interconnect structure comprising a thermally conductive layer including first and second opposing surfaces and first and second dielectric layers positioned on the first and second opposing surfaces, respectively. The multi-layered interconnect structure includes first and second pluralities of electrically conductive members positioned on the first and second dielectric layers, respectively, each of the first and second pluralities of the electrically conductive members being adapted for having solder connections thereon, for being electrically connected to a semiconductor chip and a circuitized substrate, respectively. The thermally conductive layer is comprised of a material having a selected thickness and coefficient of thermal expansion to substantially prevent failure of the solder connections between the first plurality of electrically conductive members and the semiconductor chip and between the second plurality of electrically conductive members and the circuitized substrate.

According to another aspect of the invention there is provided a method of making a multi-layered interconnect structure adapted for electrically interconnecting a semiconductor chip and a circuitized substrate using solder connections, the method comprising the steps of providing a thermally conductive layer including first and second opposing surfaces and positioning first and second dielectric layers on the first and second opposing surfaces of the thermally conductive layer, respectively. The method further includes the step of positioning first and second pluralities of electrically conductive members on the first and second dielectric layers, respectively, each of the first and second pluralities of the electrically conductive members being adapted for having solder connections thereon for being electrically connected to a semiconductor chip and a circuitized substrate, respectively. The thermally conductive layer is comprised of a material having a selected thickness and coefficient of thermal expansion to substantially prevent failure of the solder connections between the first plurality of electrically conductive members and the semiconductor chip and between the second plurality of electrically conductive members and the circuitized substrate.

According to yet another aspect of the invention, there is provided an electronic package comprising a semiconductor chip having a first surface, the first surface including a plurality of contact members, and a multi-layered interconnect structure adapted for electrically interconnecting the semiconductor chip to a circuitized substrate. The multi-layered interconnect structure includes a thermally conductive layer having first and second opposing surfaces, first and second dielectric layers positioned on the first and second opposing surfaces, respectively, and first and second pluralities of electrically conductive members positioned on the first and second dielectric layers, respectively. The first plurality of electrically conductive members includes a plurality of solder connections electrically connected thereto, respective ones of the solder connections being electrically connected to respective ones of the plurality of contact members on the semiconductor chip. The thermally conductive layer being comprised of a material having a selected thickness and coefficient of thermal expansion to substantially prevent failure of the solder connections between the first plurality of electrically conductive members and the semiconductor chip.

According to still yet another aspect of the invention, there is provided a method of making an electronic package comprising the steps of providing a semiconductor chip having a first surface, the first surface including a plurality of contact members thereon and providing a multi-layered interconnect structure adapted for electrically interconnecting the semiconductor chip to a circuitized substrate, the multi-layered interconnect structure including a thermally conductive layer, having first and second opposing surfaces, first and second dielectric layers positioned on the first and second opposing surfaces, respectively, and first and second pluralities of electrically conductive members positioned on the first and second dielectric layers, respectively. The method further includes the step of providing a first plurality of solder connections on the first plurality of electrically conductive members and connecting respective ones of the first plurality of solder connections to respective ones of the plurality of contact members on the semiconductor chip. The thermally conductive layer being comprised of a material having a selected thickness and coefficient of thermal expansion to substantially prevent failure of the solder connections between the first plurality of electrically conductive members and the semiconductor chip.

DETAILED DESCRIPTION OF THE INVENTION

The present invention provides an electronic package which includes a multi-layered interconnect structure (an organic chip carrier) and a semiconductor chip, the multi-layered interconnect structure being relatively compliant and having a CTE of about 10 to about 12 ppm/° C. which can substantially prevent failure of interconnections between the semiconductor chip and a printed circuit board to which the package can be assembled.

Figure 1:
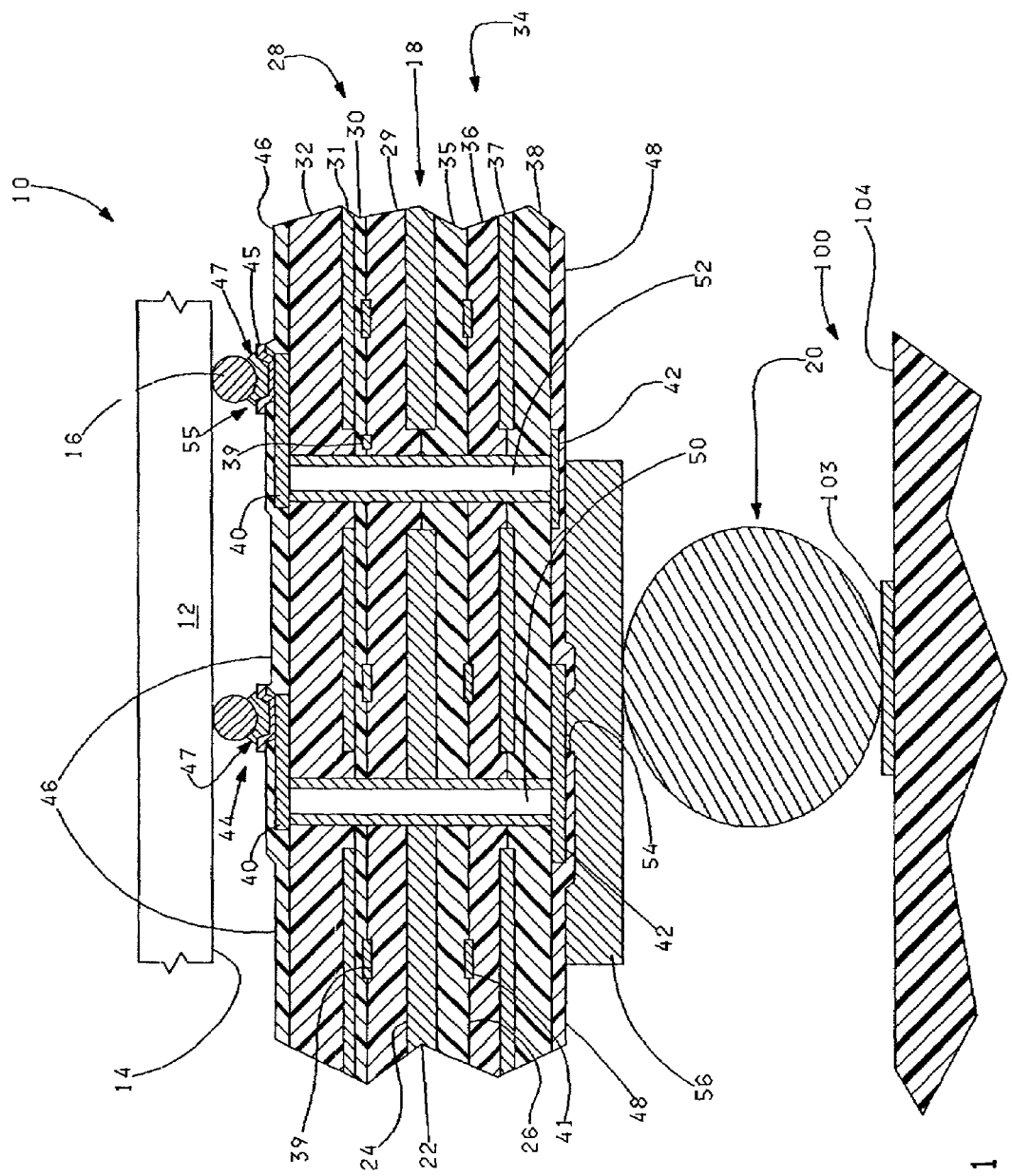
FIG. 1 is a much enlarged partial sectional view, in elevation, of the electronic package of the present invention illustrating a semiconductor chip assembled to a multi-layered interconnect structure and the multi-layered interconnect structure assembled to a circuitized substrate.

Referring to FIG. 1, a partial sectional view, in elevation, of one embodiment of the electronic package 10 of the invention is shown. The electronic package 10 includes a semiconductor chip 12 having a first surface 14, the first surface including a plurality of contact members 16, thereon. The plurality of contact members are preferably Controlled Collapse Chip Connection (C4) solder balls, each coupled to respective contact (not shown) on the chip's first surface 14. Other contact member shapes that can be used in this invention are columns and cylinders. C4 solder balls are comprised of solder material preferably having a composition of about 97% lead and about 3% tin with a melting point of about 310° C. The electronic package includes a multi-layered interconnect structure 18, preferably an organic chip carrier, adapted for electrically interconnecting the semiconductor chip 12 to a circuitized substrate 100 (e.g., printed circuit board) by means of a plurality of solder connections 20, preferably solder balls. The multi-layered interconnect structure 18 (which will be described in detail below) includes a thermally conductive layer 22 having first and second opposing surfaces 24 and 26, respectively. A first dielectric layer 28, which may include sublayers 29,30,31 and 32, is positioned on the first opposing surface 24 and a second dielectric layer 34, which may include sublayers 35, 36, 37 and 38, is positioned on the second opposing surface 26. Layers 29, 30 and 32 of first dielectric layer 28 and layers 35,36 and 38 of second dielectric layer 34 are composed of an organic polymeric material, preferably filled with a particulate material. The dielectric constant of these dielectric layers is preferably from about 1.5 to about 3.5, more preferably from about 2 to about 3. The thickness of the filled dielectric layers can vary according to the desired design performance characteristics of structure 18. Preferably, the thickness of each of the dielectric layers 28 and 34 is from about 0.001 inches (1 mil) to about 9 mils. Significantly, the dielectric material does not contain conventional woven fiberglass; such absence of woven fiberglass enabling through holes to be closely spaced. Indeed, spacing less than 100 mils, preferably less than 50 mils, more preferably 25 mils, most preferably less than 10 mils between centers, is achievable without electrical shorting between adjacent conductive through holes. The coefficient of thermal expansion of each of the dielectric layers 28 and 34 is preferably from about 2 to about 8 ppm/° C., more preferably from about 2 to about 3 ppm/° C. Preferably, the particulate filler has a diameter less than about 10 μm, more preferably from about 5 to about 8 μm. Preferably, the particulate filler is present from about 30 to about 70 percent by weight, more preferably from about 40 to about 60 percent by weight of the material. Preferably, the particulate filler is silica. Suitable materials for the dielectric layer include, for example, cyanate ester and polytetrafluoroethylene. A suitable silica filled polytetrafluoroethylene is available as HT 2800 from Rogers Corporation (Rogers, Conn.). First dielectric layer 28 and second dielectric layer 34 can also include first and third electrically conductive layers 31 and 37, respectively, within the dielectric layers for serving as power and/or ground connections. The first dielectric layer 28 and the second dielectric layer 34 can further include second and fourth electrically conductive layers 39 and 41, respectively. Electrically conductive layers 39 and 41 are preferably signal carrying conductors. The second electrically conductive layer 39 is positioned between the first electrically conductive layer 31 and the thermally conductive layer 22. The fourth electrically conductive layer 41 is positioned between the third electrically conductive layer 37 and the thermally conductive layer 22. Electrically conductive layers 31, 37, 39, and 41 can be comprised of a suitable metal such as copper or aluminum, (preferably copper) and can have a thickness of from about 0.20 to about 1.0 mils, preferably about 0.50 mils. An important aspect of the current invention is that each of the signal carrying layers 39 and 41 is shielded on either side by an electrically conducting layer which significantly reduces signal noise. Signal carrying layer 39 is shielded by electrically conducting layers 31 and 22, while signal carrying layer 41 is shielded by electrically conducting layers 37 and 22.

A first plurality of electrically conductive members 40 is positioned on the first dielectric layer 28 and a second plurality of electrically conductive members 42 is positioned on the second dielectric layer 34. These electrically conductive members are preferably comprised of a metal, the preferred metal being copper. The first and second pluralities of electrically conductive members 40 and 42 can have thicknesses ranging from about 0.25 to about 1.5 mils. A plurality of solder connections 47 positioned on a plurality of microvias 55 and in electrical contact with the first plurality of electrically conductive members 40 are electrically connected to respective ones of the plurality of contact members 16 on the semiconductor chip 12. The microvias 55 are a first plurality of openings with internal walls formed in a third dielectric layer 46 that expose at least portions of the first plurality of electrically conductive members 40. Each of the first plurality of openings includes a layer of electrically conductive material 45, preferably copper, positioned on the internal walls of the first plurality of openings and on portions of selected ones of the plurality of first electrically conductive members 40. The plurality of solder connections 47 are comprised of a low melt solder (melting temperature below about 230° C.), preferably eutectic solder, comprised of a composition of about 63% lead and about 37% tin.

The thermally conductive layer 22 is comprised of a material having a selected thickness and coefficient of thermal expansion to substantially prevent failure of the solder connections 47 between the first plurality of electrically conductive members 40 and semiconductor chip 12. Thermally conductive member 22 can be a suitable metal comprised of nickel, copper, molybdenum, or iron. Preferably, the thermally conductive layer also functions as a ground plane. The preferred thermally conductive layer (which has a CTE of close to zero) is a three layered structure comprised of a first layer of copper, a second layer of an alloy of about 34% to about 38% nickel (preferably about 36% nickel) and about 62% to about 66% iron (preferably about 63% iron), and a third layer of copper. The overall CTE of thermally conductive layer 22 is from about 4 to about 8 ppm/° C. Preferably, about 72% to about 80% of the thickness of the thermally conductive layer is the nickel-iron alloy and about 20% to about 28% of the thickness of the thermally conductive layer is copper. A suitable 36% nickel-63% iron alloy is available from Texas Instruments Incorporated (Attleboro, Mass.). Alternatively, the thermally conductive layer can be formed solely of a single metal alloy such as a about 36% nickel-about 63% iron alloy. The thickness of the thermally conductive layer is preferably from only about 1 mil to about 3 mils. The thickness and choice of material for the thermally conductive layer will determine the CTE of the thermally conductive layer and, significantly, can be used to control the CTE of the multi-layered interconnect structure when used in combination with the other elements defined herein. When the overall CTE of the multi-layered interconnect structure is controlled to a value of about 10 to about 12 ppm/° C., a significant advantage is achieved. Strain control on the solder connections 47 of the electronic package is realized and localized regions of high strain are avoided during operation of the package (when assembled to a circuitized substrate and in field operation). The overall strain between the semiconductor chip 12, with a CTE of about 2–3 ppm/° C., and the circuitized substrate, with a CTE of about 17–20 ppm/° C., is thus significantly reduced in magnitude.

Layers 29, 30, 32 of first dielectric layer 28 and layers 35, 36, and 38 of second dielectric layer 34 are preferably comprised of a filled organic polymeric material having an effective modulus from about 0.01 to about 0.50 Million pounds per square inch (Mpsi), preferably, the effective modulus is from about 0.03 to about 0.10 Mpsi. The dielectric material is material which can deform in an elastic manner under stress, and with sufficient stress can deform in an elastic-plastic manner. The effective modulus is defined as a secant modulus which in turn is defined as a relation of the tensile stress to total strain of an elastic-plastic stress-strain material test stress response curve (see, for example, A. Blake, "Practical Stress Analysis in Engineering Design", Marcel Dekker: 270 Madison Ave., New York, N.Y. 10016, 1982.) It is useful to employ a dielectric material having a measured tensile secant modulus within the range of 0.01 to 0.5 Mpsi, measured at room temperature, with a strain rate between the values of 0.01/min and 0.6/min, with the test conducted at a temperature between 10 and 30° C. When the first and second dielectric layers are comprised of a material with this effective modulus, the multi-layered interconnect structure is relatively compliant and warpage during operation of the electronic package is greatly reduced. This unique combination of the reduced CTE thermally conductive layer and the compliant (during operation) dielectric layers assures the substantial prevention of failure of the solder connections between the semiconductor chip and structure 18 and between structure 18 and the circuitized substrate. As a result, semiconductor chip 12 will experience much less warpage than would occur with laminates made of typical organic materials. Multi-layered interconnect structure 18 is capable of absorbing a modest amount of internal shear strain under the die. If an encapsulant is applied between the semiconductor chip 12 and the multi-layered interconnect structure 18, the compliancy of the structure will result in significantly less stress within the encapsulant. The combination of the strain control on the solder connections 47 and the reduced tendency for the electronic package to warp both contribute to preventing failure of the solder connections 47 between the first plurality of electrical conductive members 40 and semiconductor chip 12.

A first plated through hole 50 is positioned under semiconductor chip 12 and is electrically connected to at least one electrically conductive member of the first plurality of electrically conductive members 40 and to at least one electrically conductive member of the second plurality of electrically conductive members 42. First plated through hole 50 is also electrically connected to at least one of the first plurality of shielded signal conductors which comprise conductive layer 39. A second plated through hole 52 is positioned under semiconductor chip 12 and is also electrically connected to at least one electrically conductive member of the first plurality of electrically conductive members 40 and to at least one electrically conductive member of the second plurality of electrically conductive members 42. Second plated through hole 52 is also electrically connected to at least one of the second plurality of shielded signal conductors which comprise conductive layer 41. First and second plated through holes 50 and 52 respectively, have a unplated diameter from about 1.5 to about 3.0 mils and can be formed by mechanical or laser drilling, preferably by laser drilling with a commercially YAG or excimer laser. The plated through holes include a layer of about 0.15 to about 1.0 mils of a suitable plated metal, preferably copper. It is preferable that each contact site of the semiconductor chip be electrically connected to no more than one plated through hole.

A third dielectric layer 46 is positioned on the first dielectric layer 28 and on at least a portion of selected ones of the first plurality of electrically conductive members 40. The third dielectric material can substantially cover (tent) the first plated through hole 50 and partially fill the plated through hole. A fourth dielectric layer 48 is positioned on the second dielectric layer 34 and on at least a portion of selected ones of the second plurality of electrically conductive members 42. The dielectric material can be a suitable organic polymeric material. One dielectric material that can be used is a polyimide material. Another material that can be used is a resin material coated onto a copper foil. The preferred polymeric dielectric, being both photo-imageable and laser ablatable, has solids which are comprised of from about 10% to about 80% (preferably about 30%) of phenoxy polyol resin which is the condensation product of epichlorohydrin and bisphenol A, having a molecular weight of from about 40,000 to about 130,000; from about 20% to about 90% (preferably about 25%) of an epoxidized multi-functional bisphenolA; a formaldehyde novolac resin having a molecular weight of from about 4,000 to about 10,000 (preferably about 5,000 to about 7,000); from 0% to about 50% and preferably about 45%, of a halogenated, preferably brominated, deglycidyl ether of bisphenolA having a molecular weight of from about 600 to about 2,500; and from about 0.1 to about 15 parts (preferably about 5 parts) by weight of the total resin weight as cationic photo-initiator. The solvent component of the dielectric is preferably comprised of propylene glycol monomethyl ether acetate and about 0% to less than about 10% propylene carbonate, the propylene carbonate being the preferred carrier for the preferred photo-initiator.

Third dielectric layer 46 includes the aforementioned plurality of microvias 55. The first plurality of microvias 55 are a first plurality of openings defined by internal walls formed in third dielectric layer 46 that expose portions of selected ones of the first plurality of electrically conductive members 40. Each of the first plurality of openings includes a layer of electrically conductive material 45 positioned on the internal walls of the first openings and, preferably, also on the exposed portions of the first plurality of electrically conductive members 40. Selected ones of the first plurality of microvias 55, preferably, electrically couple to respective ones of solder connections 47. Each of the solder connections 47 are designed to efficiently match the pattern of contact members 16 on semiconductor chip 12. Preferably, there is a match of no more than one contact member 16 with one of the plated through holes 50 or 52 under the semiconductor chip providing a direct electrical path from each of the contact members 16 to either the signal carrying second electrical conductive layer 39 (through one of the solder connections 47, one of the first electrically conductive members 40 and plated through hole 50) or to the signal carrying fourth electrically conductive layer 41 (through one of the solder connections 44, another first electrically conductive member 40 and through plated through hole 52). The direct electrical path from a contact member 16 to a shielded signal conductor provides a relatively short and efficient electrical path for signals to be transmitted from the semiconductor chip 12 through the multi-layered interconnect structure and to the outside environment through solder connections 20.

The fourth dielectric layer 48 includes a second plurality of microvias 54. The second plurality of microvias are a second plurality of openings with internal walls formed in the fourth dielectric layer that expose portions of electrically conductive members 42 that each may also be connected to a respective plated through hole. Each of the second plurality of openings includes a layer of electrically conductive material positioned on the internal walls of the openings and on the exposed portions of the second plurality of electrically conductive members 42 to form a plurality of bonding pads 56. The conductive material on the internal walls of the first and second pluralities of openings and on the exposed portions of the first and second pluralities of electrically conductive members 40 and 42 in the third and fourth dielectric layers is preferably plated copper.

The electronic package can further include a circuitized substrate 100 having a plurality of contact pads 103 on a first surface 104, which pads are electrically connected to respective ones of solder balls 20 on multi-layered interconnect structure 18. Typically, the solder balls are arranged in a ball grid array (BGA) arrangement to efficiently allow electrical signal transmission and power distribution out of and into the electronic package. The solder balls can also be comprised of columns or other shapes to provide the appropriate stand off and appropriate strain relief between multi-layered interconnect structure 18 and circuitized substrate 100. Typically the solder balls are comprised of a low melt solder metallurgy, preferably a eutectic solder material.

Figure 2:
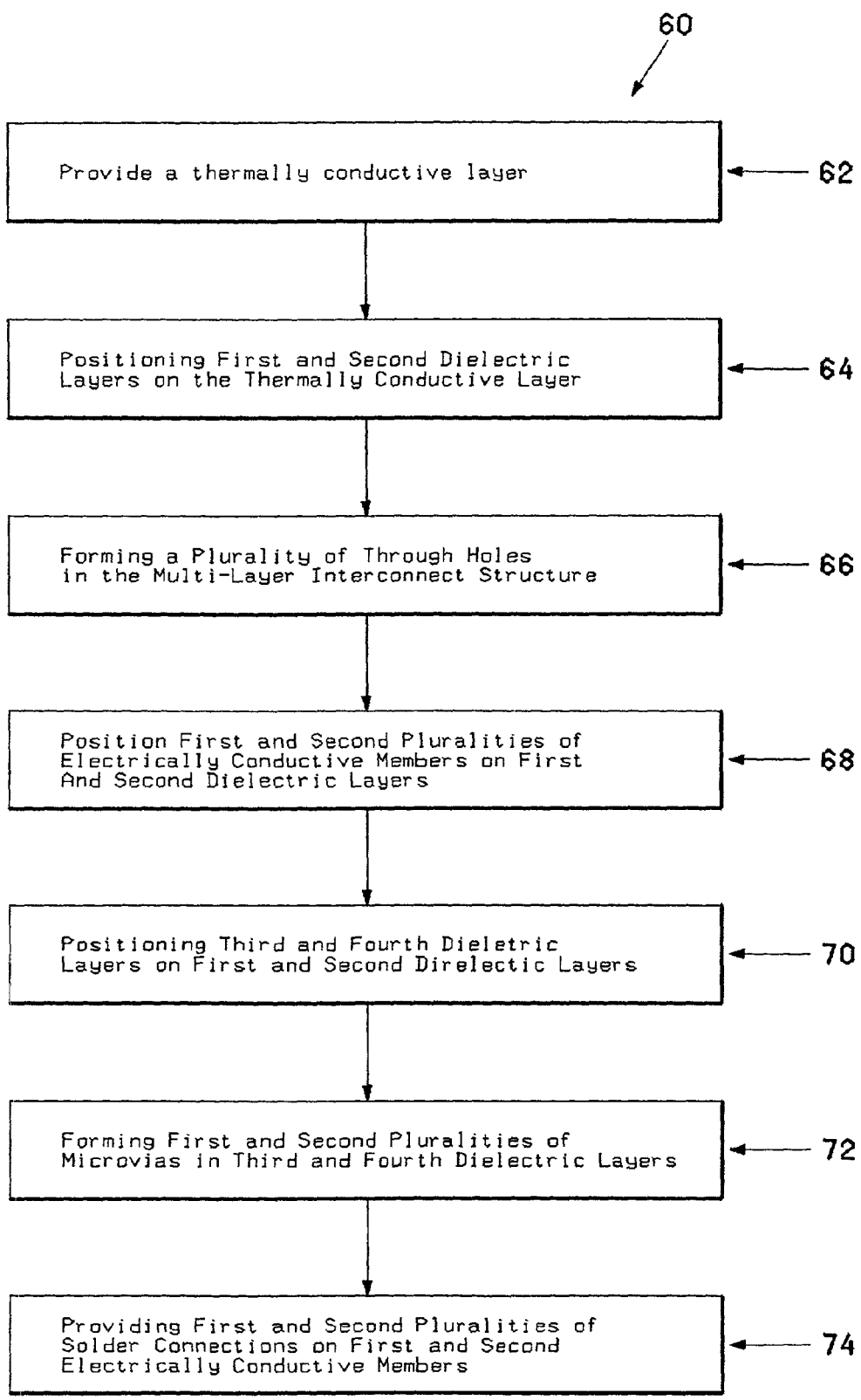
FIG. 2 is a process flow diagram showing the method for making the electronic package according to the present invention.

Referring to FIG. 2, a method 60 of making a multi-layered interconnect structure is shown. The resulting multi-layered interconnect structure, as defined herein, is adapted for electrically interconnecting a semiconductor chip and a circuitized substrate using solder connections. The first step 62 in this method is providing a thermally conductive layer having first and second opposing surfaces. The multi-layer interconnect structure has been previously described in detail above and includes a thermally conductive layer material having a selected thickness and coefficient of thermal expansion. Next, step 64 includes positioning first and second dielectric layers on the first and second opposing surfaces of the thermally conductive layer. This step is performed by laminating copper clad, silica filled PTFE layers in a laminating press at a pressure of about 1000 to about 2000 pounds per square inch (psi.) and at a temperature of about 600 to about 750 degrees Fahrenheit (° F.) to the first and second opposing surfaces of the thermally conductive layer.

Step 66 includes forming a plurality of through holes in the multi-layered interconnect structure by laser drilling with a YAG or excimer laser. Other suitable means of drilling are possible, such as mechanical drilling. The through holes formed are from about 0.5 to about 2.0 mils in diameter. The holes and the internal walls of the holes are then cleaned in preparation for the addition of a conductive layer. The copper cladding on the first and second dielectric layers and the internal walls of the plurality of through holes are then electrolessly seeded and plated with a continuous layer of a metal. The walls are plated with a thickness of metal from about 0.1 to about 1.0 mils. Suitable metals are copper and aluminum, with copper being the preferred metal. Step 68 illustrates positioning first and second pluralities of electrically conductive members on the first and second dielectric layers. To achieve this, a photoresist is applied on the surfaces of the plated copper clad dielectric layers. The photoresist tents the plurality of plated through holes to protect the plated internal walls of the plated through holes from subsequent etching steps. The photoresist is then exposed and developed. A pattern of first and second pluralities of electrically conductive members is then formed by etching the exposed portions of the plated metal and the copper cladding on the surface of the first and second dielectric layers with a cupric etch. The photoresist is then stripped with a caustic stripper, such as sodium hydroxide, resulting in first and second pluralities of electrically conductive metal members on the surfaces of the first and second dielectric layers. The first plurality of electrically conductive members are preferably formed as substantially dog bone shaped segments. Each segment includes at least two metal pads; one end of the substantially dog bone shaped segment, the first metal pad, being connected to the metal plating on the internal walls of one of the plurality of plated through holes at the surface of the first dielectric layer and the other end of the substantially dogbone shaped segment being a second metal pad adapted for having a solder connection thereon and being electrically connected to a semiconductor chip. The first and second metal pads of each substantially dogbone shaped segment are preferably connected by a substantially straight conductor segment. The second plurality of electrically conductive members are also formed of substantially dogbone shaped segments, each segment including at least two metal pads; one end of the substantially dogbone shaped segment, the third metal pad, being connected to the metal plating on the walls of one of the plurality of plated through holes at the surface of the second dielectric layer and the other end of the substantially dogbone shaped segment being a fourth metal pad adapted for having a solder connection thereon for connecting to circuitized substrate 100. The solder connection can be a solder ball, solder column, or a land. Third and fourth metal pads of the substantially dogbone shaped segments are also connected by a substantially straight conductor segment. Even though substantially dogbone shaped segments are described, many other pad shapes are possible.

Step 70 includes positioning third and fourth dielectric layers on the first and second dielectric layers and on the first and second pluralities of electrically conductive members using conventional coating processing. The dielectric material can be either the preferred polymeric dielectric, the polyimide or the epoxy coated on a copper foil, all described above. The dielectric material can also be applied by a process such as laminating or spraying and can flow into the plurality of plated thorough holes to partially fill the holes and tent the opening of the holes at the surfaces of the first and second dielectric layers.

Step 72 includes forming first and second pluralities of microvias in the third and fourth dielectric layers by a process of removing portions of the third and fourth dielectric layers to form first and second pluralities of openings and exposing at least portions of selected ones of the first and second pluralities of electrically conductive members, respectively. The microvias can be formed by a process of mechanical drilling, etching, or preferably laser ablating the third and fourth dielectric layers. The resulting openings are then plated with a suitable metal, preferably copper, forming electrical connections from the surfaces of the third and fourth dielectric layers to selected ones of the exposed first and second pluralities of electrically conductive members respectively. A solder paste is then applied to the plated first and second pluralities of microvias, the preferred solder paste being a low melt solder paste, preferably a eutectic solder paste. An examples of suitable eutectic solder paste that can be used is Alpha 3060 from Alpha Metals (Jersey City, N.J.).

Referring to step 74, the solder paste can then be reflowed to form part of the first and second pluralities of solder connections on the first and second pluralities of electrically conductive members 40 and 42, respectively.

A method of making an electronic package comprises the following steps. First a semiconductor chip is provided having a first surface which incudes a plurality of contact members. The plurality of contact members can be pads, columns, or balls of high melt solder. Hight melt solder is defined as a solder having a melting point above about 230° C. Preferably, the plurality of contact members comprises C4 solder balls. Next, a multi-layered interconnect structure, as described above, is provided. The multi-layered interconnect structure includes a first plurality of solder connections, a plurality of plated microvias including a layer of reflowed solder paste thereon. A layer of low melt solder paste, preferably eutectic solder paste, is next applied to the first plurality of solder connections and the semiconductor chip's contact members are each bought in contact with respective ones of the first plurality of solder connections by positioning respective ones of the contact members of the semiconductor chip against respective ones of the first plurality of solder connections. This is done by positioning and aligning the semiconductor chip contact members onto the solder paste. The solder paste is then reflowed and molten solder covers the exposed area of the plurality of microvias and partially wicks up the external walls of contact members 16 of the semiconductor chip. Upon cooling, the molten solder solidifies and forms an electrical connection between the semiconductor chip and the multi-layered interconnect structure. Referring to FIG. 1, this electrical connection is illustrated by numeral 47. The fact that the semiconductor contact members 16, have a higher melting point than the solder paste results in a solder standoff as well as an electrical connection between the semiconductor chip and the multi-layered interconnect structure. This aides in reducing a portion of the strain between the semiconductor chip and the multi-layered interconnect structure during operation of the package.

The electronic package of the present invention can be assembled to a circuitized substrate 100 having a plurality of contact pads 103 on one of its surfaces. As described, these contact pads can be comprised of copper or aluminum or another suitable metal and can be coated with a layer of solder paste (not shown). The second plurality of solder connections of the multi-layered interconnect structure, previously described as solder balls or columns 20, are placed in contact with the solder paste on the contact pads of the circuitized substrate. The solder paste and second plurality of solder connections are reflowed and cooled forming an electrical connection between the multi-layered interconnect structure and the circuitized substrate. The sequence of assembly of the semiconductor chip to the multi-layered interconnect structure, followed by assembly of the multi-layered interconnect structure to the circuitized substrate, can easily be modified so that the multi-layered interconnect structure without the semiconductor chip can be assembled to the circuitized substrate followed by assembly of the semiconductor chip tot he multi-layered interconnect structure-circuitized substrate assembly.

The electronic package described herein provides signal and power distribution characteristics which complement high performance electrical demands of future semiconductor chips and is particularly suited for interconnecting high I/O (greater than 400 I/O) semiconductors. A low impedance power distribution is achieved using the solid copper power planes and high density plated through holes under the semiconductor chip which allow multiple vertical power feeds to the semiconductor chip. Further electrical performance benefits and preservation of signal integrity (fast signal propagation, low signal capacitance and coupled noise, and matched characteristic impedance) are achieved in the electronic package by use of low dielectric constant PTE material (Er<3), the signal carrying conductors being arranged internally in a shielded arrangement, and a direct short path length for the semiconductor chip contact members to the signal carrying conductors.

While there have been shown and described what are at present considered the preferred embodiments of this invention, it will be obvious to those skilled in the art that various changes and modifications can be made therein without departing from the scope of the invention as defined by the appended claims.

What is claimed is:

1. A method of making a multi-layered interconnect structure adapted for electrically interconnecting a semiconductor chip and a circuitized substrate using solder connections, said method comprising the steps of:
   providing a thermally conductive layer including first and second opposing surfaces;
   positioning first and second dielectric layers on said first and second opposing surfaces of said thermally conductive layer, respectively; and
   positioning first and second pluralities of electrically conductive members on said first and second dielectric layers, respectively, each of said first and second pluralities of said electrically conductive members adapted for having solder connections thereon for being electrically connected to a semiconductor chip and a circuitized substrate, respectively, said thermally conductive layer being comprised of a material having a selected thickness and coefficient of thermal expansion to substantially prevent failure of said solder connections between said first plurality of electrically conductive members and said semiconductor chip and between said second plurality of electrically conductive members and said circuitized substrate, wherein said step of positioning said first and second dielectric layers on said first and second opposing surfaces of said thermally conductive layer, respectively, comprises laminating said first and second dielectric layers onto said first and second opposing surfaces at a pressure of from about 1000 to about 1500 psi and at a temperature of from about 600 to about 750° F.

2. The method of making the multi-layered interconnect structure of claim 1 wherein said positioning said first and second pluralities of electrically conductive members on said first and second dielectric layers, respectively, comprises the steps of:
   laminating a first copper foil and a second copper foil respectively onto said first and second dielectric layers; and
   etching selected portions of said first and second copper foils to respectively produce first and second pluralities of said electrically conductive members.

3. The method of making the multi-layered interconnect structure of claim 1 further including the steps of:
   positioning a third dielectric layer on said first dielectric layer and on said first plurality of electrically conductive members;
   removing portions of said third dielectric layer to expose portions of said first plurality of electrically conductive members; and
   forming a first plurality of microvias within said third dielectric layer to expose at least a portion of at least one of said first plurality of electrically conductive members.

4. The method of making the multi-layered interconnect structure of claim 3 wherein said removing of said portions of said third dielectric layer is performed by laser ablating.

5. The method of making the multi-layered interconnect structure of claim 1 further including the steps of:
   positioning a fourth dielectric layer on said second dielectric layer and on said second plurality or electrically conductive members;
   removing portions of said fourth dielectric layer to expose portions of said second plurality of electrically conductive members; and
   forming a second plurality of microvias within said fourth dielectric layer to expose at least a portion of at least one of said second plurality of electrically conductive members.

6. The method of making the multi-layered interconnect structure of claim 5 wherein the step of removing portions of said fourth dielectric layer is performed by laser ablating.

7. A method of making an electronic package comprising the steps of:
   providing a semiconductor chip having a first surface including a plurality of contact sites thereon;
   providing a multi-layered interconnect structure adapted for electrically interconnecting said semiconductor chip to a circuitized substrate, said multi-layered interconnect structure including a thermally conductive layer, having first and second opposing surfaces, first and second dielectric layers positioned on said first and second opposing surfaces, respectively, and first and second pluralities of electrically conductive members positioned on said first and second dielectric layers, respectively;
   providing a first plurality of solder connections on said first plurality of electrically conductive members; and
   connecting respective ones of said first plurality of solder connections to respective ones of said plurality of contact sites on said semiconductor chip, said thermally conductive layer being comprised of a material having a selected thickness and coefficient of thermal expansion to substantially prevent failure of said solder connections between said first plurality of electrically conductive members and said semiconductor chip.

8. The method of making the electronic package of claim 7 further comprising positioning a third dielectric layer on said first dielectric layer and on said first plurality of electrically conductive members, wherein said step of providing said first plurality of solder connections on said first plurality of electrically conductive members includes:

forming a plurality of openings in said third dielectric layer, each of said openings including an internal wall and exposing a portion of at least one of said first plurality of electrically conductive members;

plating a conductive layer on said internal wall of said plurality of openings and on said exposed portion of said at least one of said first plurality of electrically conductive members to define a plurality of microvias;

applying a first solder paste onto said conductive layer; and reflowing said solder paste to form a first plurality of solder connections.

9. The method of making the electronic package of claim 8 wherein said step of connecting respective ones of said first plurality of solder connections to respective ones of said plurality of contact members on said semiconductor chip further includes the steps of applying a second solder paste onto said respective ones of said first plurality of solder connections, positioning said respective ones of said contact members of said semiconductor chip against said respective ones of said first plurality of solder connections, and reflowing said second solder paste and said respective ones of said first plurality of solder connections to electrically connect said semiconductor chip to said multi-layered interconnect structure.

10. The method of making the electronic package of claim 7 further including the steps of:

providing a circuitized substrate having a first surface including a plurality of contact pads thereon;

providing a second plurality of solder connections on said second plurality of conductive members of said multi-layered interconnect structure; and connecting respective ones of said second plurality of said solder connections to respective ones of said plurality of contact pads on said substrate to make electrical connections therebetween.

11. A method of making a multi-layered interconnect structure adapted for electrically interconnecting a semiconductor chip and a circuitized substrate using solder connections, said method comprising the steps of:

providing a thermally conductive layer including first and second opposing surfaces;

positioning first and second dielectric layers on said first and second opposing surfaces of said thermally conductive layer, respectively;

positioning a first electrically conductive layer within said first dielectric layer;

positioning a second electrically conductive layer between said first electrically conductive layer and said thermally conductive layer wherein said second electrically conductive layer comprises a first plurality of shielded signal conductors; and positioning first and second pluralities of electrically conductive members on said first and second dielectric layers, respectively, each of said first and second pluralities of said electrically conductive members adapted for having solder connections thereon for being electrically connected to a semiconductor chip and a circuitized substrate, respectively, said thermally conductive layer being comprised of a material having a selected thickness and coefficient of thermal expansion to substantially prevent failure of said solder connections between said first plurality of electrically conductive members and said semiconductor chip and between said second plurality of electrically conductive members and said circuitized substrate, wherein said step of positioning said first and second dielectric layers on said first and second opposing surfaces of said thermally conductive layer, respectively, comprises laminating said first and second dielectric layers onto said first and second opposing surfaces at a pressure of from about 1000 to about 1500 psi and at a temperature of from about 600 to about 750° F.

12. The method of making the multi-layered interconnect structure of claim 11 wherein said positioning said first and second pluralities electrically conductive members on said first and second dielectric layers, respectively, comprises the steps of:

laminating a copper foil onto said first and second dielectric layers; and etching selected portions of said copper foil to produce first and second pluralities of said electrically conductive members.

13. The method of making the multi-layered interconnect structure of claim 11 further including the steps of:

positioning a third dielectric layer on said first dielectric layer and on said first plurality of electrically conductive members;

removing portions of said third dielectric layer to expose portions of said first plurality of electrically conductive members; and forming a first plurality of microvias within said third dielectric layer to expose at least a portion of at least one of said first plurality of electrically conductive members.

14. The method of making the multi-layered interconnect structure of claim 13 wherein said removing of said portions of said third dielectric layer is performed by laser ablating.

15. The method of making the multi-layered interconnect structure of claim 11 further including the steps of:

positioning a fourth dielectric layer on said second dielectric layer and on said second plurality electrically conductive members;

removing potions of said fourth dielectric layer to expose portions of said second plurality of electrically conductive members; and forming a second plurality of microvias within said fourth dielectric layer to expose at least a portion of at least one of said second plurality of electrically conductive members.

16. The method of making the multi-layered interconnect structure of claim 15 wherein the step of removing portions of said fourth dielectric layer is performed by laser ablating.

* * * * *